(12) United States Patent
Pattison

(10) Patent No.: US 11,710,803 B2
(45) Date of Patent: Jul. 25, 2023

(54) COMPLIANT SILICON SUBSTRATES FOR HETEROEPITAXIAL GROWTH BY HYDROGEN-INDUCED EXFOLIATION

(71) Applicant: RAYTHEON COMPANY, Waltham, MA (US)

(72) Inventor: James Pattison, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 280 days.

(21) Appl. No.: 17/018,407

(22) Filed: Sep. 11, 2020

(65) Prior Publication Data

US 2022/0085234 A1 Mar. 17, 2022

(51) Int. Cl.
| | |
|---|---|
| H01L 31/18 | (2006.01) |
| H01L 31/0296 | (2006.01) |
| H01L 31/0304 | (2006.01) |
| H01L 31/0352 | (2006.01) |
| H01L 21/04 | (2006.01) |
| H01L 21/20 | (2006.01) |
| H01L 21/02 | (2006.01) |

(52) U.S. Cl.
CPC .... *H01L 31/1836* (2013.01); *H01L 31/02966* (2013.01); *H01L 31/0304* (2013.01); *H01L 31/03046* (2013.01); *H01L 31/035236* (2013.01); *H01L 31/1832* (2013.01); *H01L 31/1844* (2013.01); *H01L 31/1852* (2013.01); *H01L 21/02694* (2013.01); *H01L 21/0415* (2013.01); *H01L 21/2015* (2013.01)

(58) Field of Classification Search
CPC ............... H01L 31/1836; H01L 31/18; H01L 31/02966; H01L 31/0296; H01L 31/0304; H01L 31/03046; H01L 31/035236; H01L 31/0352; H01L 31/1832; H01L 31/1844; H01L 31/1852; H01L 21/02694; H01L 21/02; H01L 21/0415; H01L 21/04; H01L 21/2015; H01L 21/20; H01L 21/0245; H01L 21/02543; H01L 21/02546; H01L 21/02549; H01L 21/02562; H01L 21/02658; H01L 21/02381
See application file for complete search history.

(56) References Cited

U.S. PATENT DOCUMENTS 6,251,754 B1 * 6/2001 Ohshima ........... H01L 21/76254
438/506

FOREIGN PATENT DOCUMENTS

| DE | 102006057064 A1 | 5/2008 |
| DE | 102008056195 A1 | 5/2009 |

OTHER PUBLICATIONS

Alfaraj "SIMOX vs. Smart-Cut: A brief overview of the silicon-on-insulator technology" Jan. 2018 (4 pages).
(Continued)

*Primary Examiner* — Calvin Y Choi
(74) *Attorney, Agent, or Firm* — Cantor Colburn LLP

(57) ABSTRACT

A method of fabricating a semiconductor device includes implanting dopants into a silicon substrate, and performing a thermal anneal process that activates the implanted dopants. In response to activating the implanted dopants, a layer of ultra-thin single-crystal silicon is formed in a portion of the silicon substrate. The method further includes performing a heteroepitaxy process to grow a semiconductor material from the layer of ultra-thin single-crystal silicon.

15 Claims, 6 Drawing Sheets

(56) References Cited

OTHER PUBLICATIONS

Lo "New approach to grow pseudomorphic structures over the critical thickness" Applied Physics Letters 59.18 (Oct. 1991) pp. 2311-2313.
Noh et al. "Ultrathin Silicon-an-Insulator (SOI) Wafer for Compliant Substrate" 2017 IEEE 44th Photovoltaic Specialist Conference (PVSC). IEEE, (Jun. 2017) pp. 858-860.
Soitec "Smart Cut™ Technology, Smart Choice—A recognized industry standard" <URL: https://www.soitec.com/en/products/smart-cut> [accessed: Sep. 1, 2020] (7 pages).
Yang "Hydrogen-induced silicon wafer splitting" Journal of applied physics 94.3 (Aug. 2003) pp. 1454-1457.
Figer et al. "HgCdTe detectors grown on silicon substrates for observational astronomy" [Proceedings of SPIE ISSN 0277-786X vol. 10524], SPIE, vol. 10709, Jul. 10, 2018, XP060110540, Abstract Only (3 pages).
Garland et al. "Substrates for the Expitaxial Growth of MCT" In: Peter Capper, James Garland: "Mercury Cadmium Telluride : Growth Properties and Applications" Sep. 4, 2010, John Wiley & Sons, Ltd, XP009531459 Abstract Only (5 pages).
International Search Report and Written Opinion issued for PCT/US2021/048974; Application Filing Date Sep. 3, 2021; dated Dec. 8, 2021 (16 pages).

\* cited by examiner

COMPLIANT SILICON SUBSTRATES FOR HETEROEPITAXIAL GROWTH BY HYDROGEN-INDUCED EXFOLIATION

BACKGROUND

The present disclosure generally relates to semiconductor devices and integrated circuits (ICs), and more specifically, to fabrication of semiconductor devices and ICs.

Epitaxy is a type of crystal growth technique in which new crystalline layers are formed with a well-defined orientation with respect to the substrate onto which the crystalline layer are grown. The newly formed crystalline layers are commonly referred to as an epitaxial film or epitaxial layer. Heteroepitaxy is a type of epitaxy, which involves growing a crystalline layer such as a single-crystal semiconductor material, for example, having a different composition, crystal lattice spacing, crystal symmetry, and/or crystal structure than the substrate on which the film is grown. Heteroepitaxy is commonly used to grow semiconductor materials on a substrate.

Narrow bandgap semiconductor alloys are a unique class of semiconductor that have material properties, such as band-gap and lattice spacing, which can be tuned by the composition of the alloy. The bandgap of the material can be adjusted or "tuned" by varying the ratio of the amount a wider bandgap semiconductor material to the amount of the narrow-bandgap semiconductor or semi-metal. The bandgap of a semiconductor is the minimum photon energy (measured in electron volts [eV]), or equivalently the longest wavelength of light (typically measured in microns), that a semiconductor will absorb. This semiconductor alloy will absorb all photons of energy equal or greater to the bandgap, or equivalently will absorb all wavelengths equal to or shorter than that wavelength of light illuminated into the semiconductor. An example of a narrow bandgap semiconductor would be the semiconductor alloy $Hg_{1-x}Cd_xTe$ (HgCdTe, MCT), which is a semiconductor alloy of CdTe, the wider bandgap material with a bandgap of approximately 1.5 eV, and HgTe, which is a semi-metal with a negative bandgap of approximately −0.29 eV. The bandgap is tuned by the "x-value" or the alloy ratio which varies from 0 (i.e. purely CdTe) to 1 (i.e. purely HgTe). Narrow bandgap semiconductor alloys are therefore employed in a wide-variety of infrared (IR) applications such as, for example, IR detectors, thermal imaging devices, and multispectral focal plane array imaging devices. This is due to the tunable bandgap, which is engineered to create a semiconductor device of desired bandgap, and hence, desired absorption wavelength.

SUMMARY

According to a non-limiting embodiment, a method of fabricating a semiconductor device includes implanting dopants into a silicon substrate. The method further includes performing a thermal anneal process that activates the implanted dopants, and in response to activating the implanted dopants forming a layer of ultra-thin single-crystal silicon in a portion of the silicon substrate. The method further includes performing a heteroepitaxy process to grow a semiconductor material from the layer of ultra-thin single-crystal silicon.

According to another non-limiting embodiment, a semiconductor device comprises a silicon substrate, and a layer of ultra-thin single-crystal silicon in a portion of the silicon substrate. The semiconductor device further comprises a semiconductor material on an upper surface of the layer of ultra-thin single-crystal silicon.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

Figure 1:
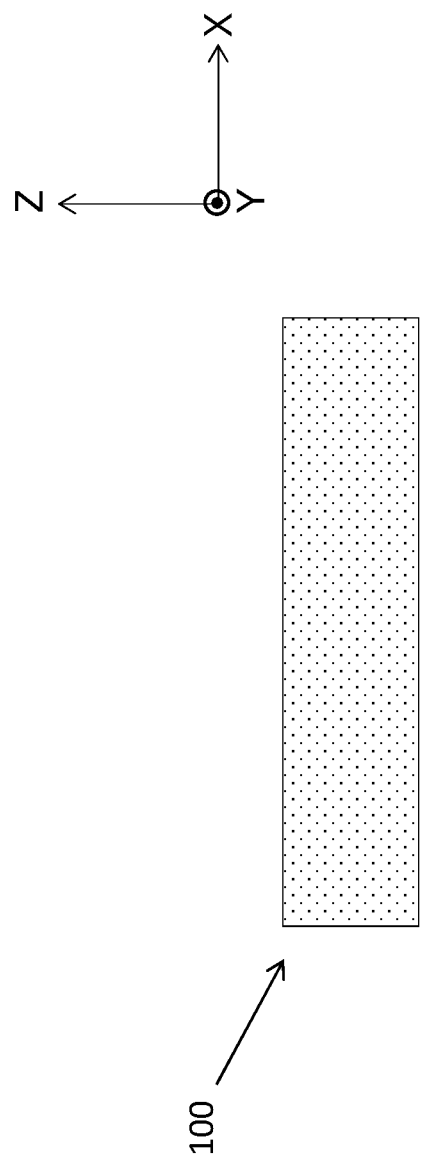
FIG. 1 depicts an intermediate substrate, according to a non-limiting embodiment.

The diagrams depicted herein are illustrative. There can be many variations to the diagram or the operations described therein without departing from the spirit of the disclosure. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present disclosure are described herein with reference to the related drawings. Alternative embodiments can be devised without departing from the scope of this disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device or IC utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation.

The aforementioned doping processes can be followed by a thermal anneal process such as, for example, furnace annealing or rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the disclosure, heteroepitaxy is commonly used to grow semiconductors, either alloy or single component, of either direct- or indirect-bandgap on a substrate. Substrates comprising silicon (Si) are desirable due their wide availability, low costs, high strength, and desirable thermal-expansion coefficient. However, there is a substantial lattice mis-match between the grown semiconductor alloy such as mercury cadmium telluride (HgCdTe), for example, and the Si substrate. As a result, materials with a different lattice spacing that are heteroepitaxially grown on a Si substrate are plagued by high-threading dislocation densities compared to single-crystal or alloyed semiconductors grown on lattice-matched substrates (such as HgCdTe growth onto CdZnTe which has a lattice constant closely matched to HgCdTe, for example), and reduce the performance of the resulting semiconductor device.

Turning now to an overview of the aspects of the disclosure, one or more non-limiting embodiments of the disclosure address the above-described shortcomings of the prior art by providing a method of heteroepitaxially growing a semiconductor material on a Si substrate to provide a semiconductor device having a substantially lower threading dislocation density (e.g. in the epitaxially grown semiconductor material) compared to conventional semiconductor devices grown on Si substrates.

In one or more non-limiting embodiments, a Si substrate is pre-treated by performing a hydrogen implantation process prior to heteroepitaxially growing a semiconductor material on the Si substrate. The hydrogen employed in the implantation can exist in different compositions or variants including, but is not limited to, diatomic, ionic, radical, atomic, proton, and deuterium. A thermal anneal process is then performed, which activates the implanted hydrogen and induces an exfoliation effect that produces a thin-layer of single crystal silicon atop the remaining portion of the Si substrate, which is thin enough to accommodate stress and strain into the thin-layer of single crystal Si rather than the subsequent epilayer (such as HgCdTe). The term "exfoliation" as described herein refers to the formation of ultra-thin (e.g., nanometers) films of silicon induced by hydrogen implant cavitation and coalescence by a "smart cut" like process, but without a handle wafer. Accordingly, a semiconductor material can be heteroepitaxially grown on the thin-layer of Si to form a semiconductor epitaxial device layer having a substantially reduced threading dislocation density due to the accommodation of mechanical stress and strain into the thin-layer of Si.

With reference now to FIG. 1, an intermediate substrate 100 is illustrated following one or more processing operations according to one or more embodiments of the disclosure. In the present specification and claims, an "intermediate" substrate is defined as a substrate in a stage of fabrication prior to a final stage. The intermediate substrate 100 extends along a first axis (e.g., an X-axis) to define a horizontal length, a second axis (e.g., a Y-axis) orthogonal to the first axis to define a horizontal width, and a third axis (e.g., a Z-axis) orthogonal to the first and second axes to define a vertical height.

The intermediate substrate 100 comprises various materials including semiconductor materials such as silicon (Si). The Si material can include, but is not limited to, Si having a {211} crystal-orientated plane referred to herein as "Si (211)". In one or more non-limiting embodiments, the substrate 100 can have a thickness or height (e.g., extending along the Z-axis) ranging, for example, from about 500 μm to about 1000 μm.

Figure 2:
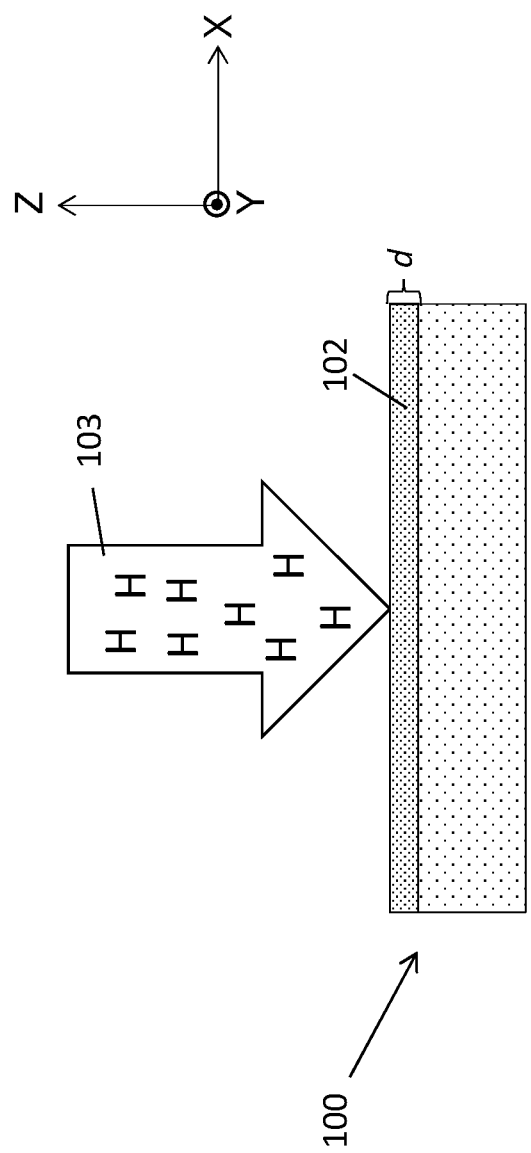
FIG. 2 depicts the substrate undergoing a hydrogen implantation process according to a non-limiting embodiment.

Turning now to FIG. 2, the substrate 100 is illustrated undergoing a hydrogen implantation process according to a non-limiting embodiment of the invention. At this stage, hydrogen is directed toward the substrate 100 (as indicated by arrow 103) using any known implantation process including, but not limited to, ion-beam implantation, plasma doping (PLAD), and plasma immersion ion implantation (PIII). Although hydrogen is described herein, it should be appreciated that other dopants can be employed such as boron (B), for example, without departing from the scope of the invention.

In one or more embodiments, the time at which the implantation process is performed can be varied so as to control the depth at which the hydrogen is implanted in the substrate 100. In one or more non-limiting embodiments the hydrogen implant extends from an upper region located at the upper surface of the substrate 100 to a lower region located in the substrate 100 to define a depth ranging, for example, from about 10 nm to about 100 nm, or less than 100 nm.

Figure 3:
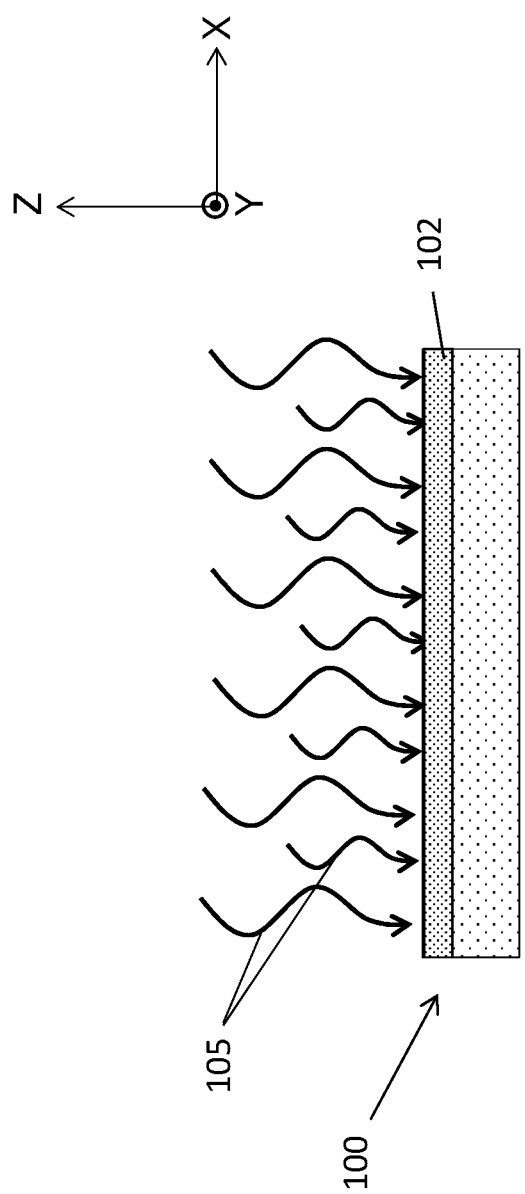
FIG. 3 depicts the substrate undergoing a thermal anneal process to induce exfoliation by action of the implanted hydrogen, according to a non-limiting embodiment.

Referring to FIG. 3, the substrate is illustrated undergoing a thermal anneal process according to a non-limiting embodiment. The thermal anneal process applies heat (indicated by arrows 105) to the substrate 100, which in turn serves to activate the hydrogen. Various known annealing processes can be employed including, but not limited to, furnace annealing and rapid thermal annealing (RTA).

Figure 4:
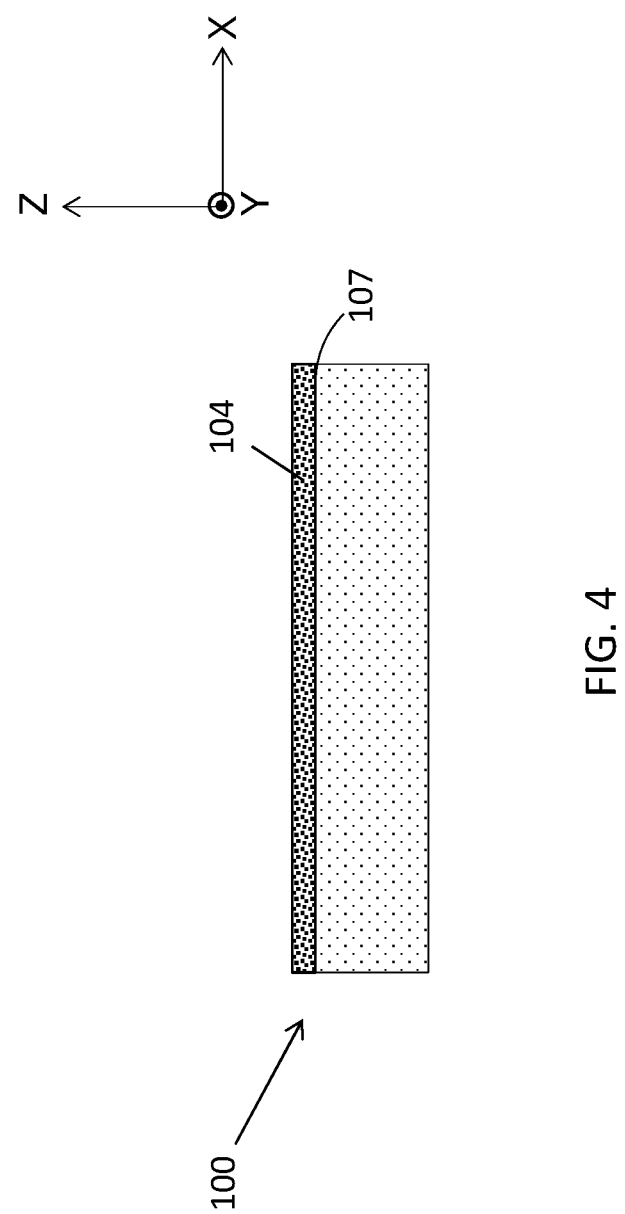
FIG. 4 depicts the substrate including a thin-layer of single-crystal Si resulting from the thermal anneal process according to a non-limiting embodiment.

Turning to FIG. 4, the substrate 100 is illustrated following the aforementioned thermal anneal process. As a result of the thermal anneal, an ultra-thin single-crystal silicon layer 104 is formed in the substrate 100. More specifically, the presence of the hydrogen dopants during the thermal anneal induces an exfoliation effect that produces an ultra-thin layer of strained Si crystals 104. The ultra-thin layer of strained Si crystals 104 can be viewed as a free-standing, single-crystal layer of Si(211), which is bound at an interface 107 by physisorption, i.e., bound without any chemical bonds. Applying heat to the hydrogen induces the exfoliation effect from a variety of mechanisms which are not limited to cavitation by coalescence of implanted hydrogen, bubble formation, recombination of atomic hydrogen into diatomic hydrogen, dissociation of diatomic hydrogen into atomic hydrogen; any effect induced by the thermal treatment that mechanically causes the formation of ultra-thin single-crystal silicon (or "foil") to be created out of the starting substrate.

In one or more non-limiting embodiments, a portion of the implanted hydrogen remains in the interface 107 between Si crystals 104 and the underlying portion 108 of the Si substrate 100 following the formation of the ultra-thin single-crystal silicon layer 104. In some non-limiting embodiment, portions of the implanted hydrogen are present in the interface 10, along with the underlying portion 108 the ultra-thin single-crystal silicon layer 104 following the formation of the ultra-thin single-crystal silicon layer 104.

In one or more embodiments, the ultra-thin single-crystal silicon 104 extends into the substrate 100 at a depth (d) controlled by the depth of the previously hydrogen dopants. In one or more non-limiting embodiments, the Si crystal layer 104 extends from an upper region located at the upper surface of the substrate to a lower region located in the substrate 100 to define a thickness (e.g. vertical height extending along the Z-axis), for example, from about 10 nm to about 100 nm, or less than 100 nm. The distance between the upper region and the lower region defines the ultra-thinness of the Si crystal layer 104. The ultra-thinness of the ultra-thin single-crystal silicon 104 allows it to be compliant, or able to be "squeezed" either under tensile or compressive stresses without inducing threading dislocations into any subsequent thin films grown thereon. (e.g., HgCdTe grown on the Si crystal layer 104).

Figure 5:
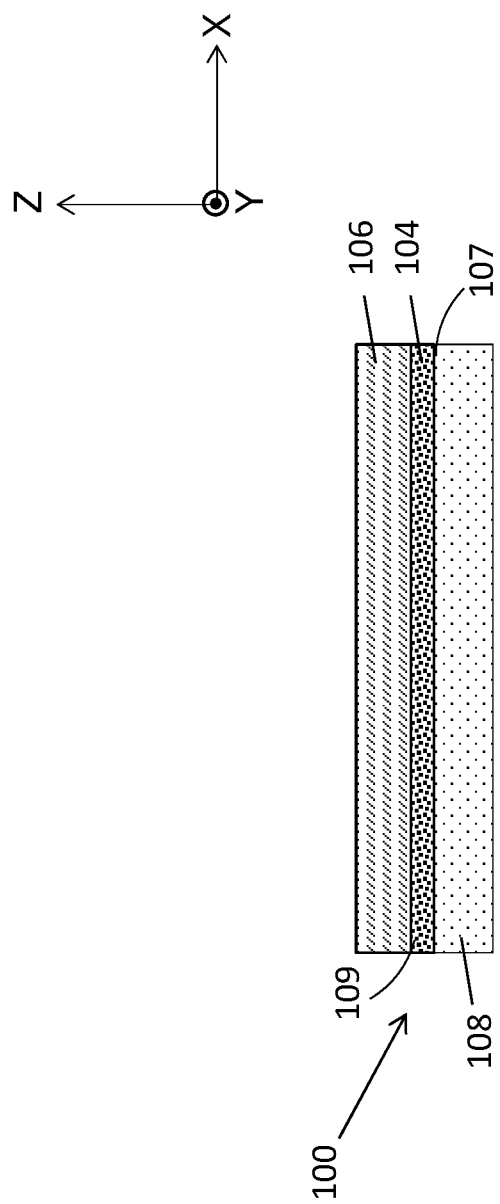
FIG. 5 depicts the substrate following a heteroepitaxy process having grown an epitaxial semiconductor material on the thin-layer of single-crystal Si.

Turning now to FIG. 5, the substrate is illustrated following formation of a semiconductor material 106 on the ultra-thin single-crystal silicon 104 according to a non-limiting embodiment. In one or more non-limiting embodiments, the semiconductor material 106 directly contacts the ultra-thin single-crystal silicon 104 to define a second interface 109. The semiconductor material 106 includes, but is not limited to, HgCdTe (also referred to as "MCT" or "MerCad"), gallium indium arsenide antimonide phosphide (GaInAsSbP), and indium arsenide-gallium antimonide (InAs/GaSb) superlattices. The thickness (e.g., the vertical distance along the Z-axis) of the semiconductor material 106 can range, for example, from about 1 to 50 microns, or less than 50 um. As further illustrated in FIG. 5, the ultra-thin single-crystal silicon 104 is interposed between the semiconductor material 106 and the underlying portion 108 of the Si substrate 100. In one or more non-limiting embodiments, the ultra-thin single-crystal silicon 104 can be contained completely between the first interface 107 and the second interface 109.

In one or more non-limiting embodiments, a heteroepitaxy process is performed using molecular beam epitaxy (MBE), for example, to grow the semiconductor material 106 from the upper surface of the ultra-thin single-crystal silicon 104. Growing the semiconductor material 106 atop layer 104 can also convert the underlying portion 108 of the Si substrate 100 into Si:As if the semiconductor material 106 is a polar semiconductor including, but not limited to, HgCdTe. A polar semiconductor is typically referred to as a semiconductor material that includes polar bonds rather than a non-polar semiconductor material such as, for example, carbon (C), pure silicon (Si), germanium (Ge), and tin (Sn). In non-limiting embodiments where the ultra-thin single-crystal silicon 104 is a polar semiconductor, arsenic passivated Si(211), for example, is employed as the Si substrate 100 due to the insufficient number of electrons (i.e., either too many electrons or too few electrons) in the Si-to-polar element (e.g., Cd or Te) bond. Accordingly, an arsenic passivated Si(211) surface (e.g., SiAs or Si(211):As) can be used to grow a polar semiconductor on a non-polar semiconductor material.

Unlike conventional processes, however, the threading dislocation density in the semiconductor material 106 is significantly reduced. For example, the method described herein can achieve a threading dislocation that is less than about 1e5 cm$^{-2}$. This result is achieved because the ultra-thin single-crystal silicon 104 is thin enough to accommodate stress and strain into the ultra-thin single-crystal silicon 104 rather than the semiconductor material 106. The ultra-thin single-crystal silicon 104 is only held by physisorption i.e. no chemical bonds, which allows the ultra-thin single-crystal silicon 104 to be compressed or stretched in any dimension necessary to accommodate the stress and strain induced by the growth of much thicker semiconductor material 106, and hence the misfit dislocations created by the lattice spacing mismatch between 104 and semiconductor material 106, which normally then turn into threading dislocations during growth of semiconductor material 106 and propagate into semiconductor material 106, and instead thread into the ultra-thin single-crystal silicon 104, thereby reducing or eliminating threading dislocation densities of the semiconductor material 106. Accordingly, the reduced performance found in conventional semiconductor devices having semiconductor materials heteroepitaxially grown on Si substrates can be avoided.

Figure 6:
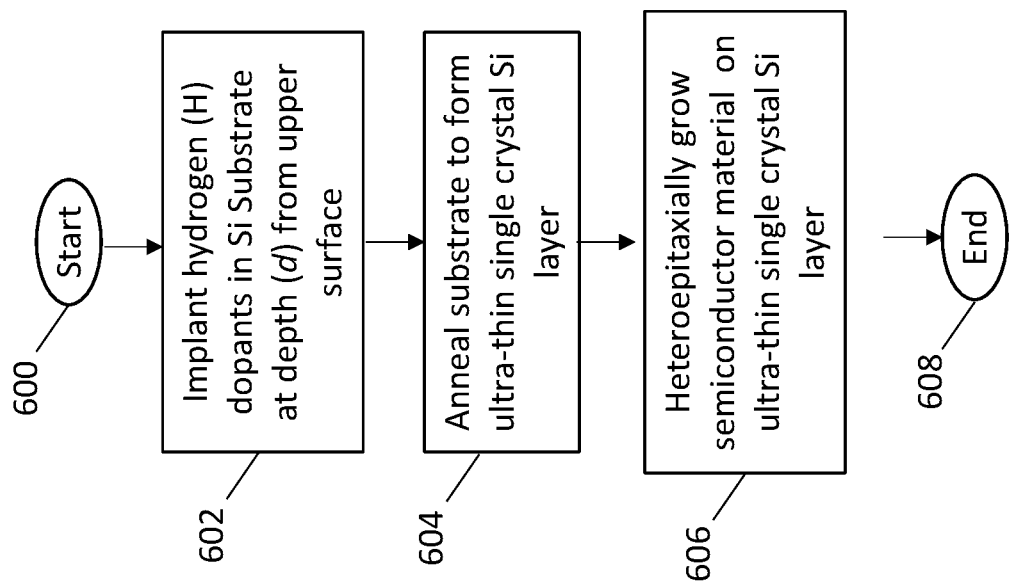
FIG. 6 is a flow diagram illustrating a method of fabricating a semiconductor device including an epitaxial layer having a substantially reduced threading dislocation density according to a non-limiting embodiment.

With reference now to FIG. 6, a method of fabricating a semiconductor device including an epitaxial layer having a substantially reduced threading dislocation density is illustrated according to a non-limiting embodiment. The method begins at operation 600, and at operation 602 Hydrogen is implanted into a Si substrate. In one or more embodiments, the Hydrogen is implanted to depth (d). At operation 604, the Si substrate is annealed to activate the hydrogen dopants so as to form an ultra-thin single crystal silicon layer. In one or more embodiments, the ultra-thin single crystal silicon layer has a thickness defined, or substantially defined, by the depth of the hydrogen dopants. As described herein, the ultra-thin single crystal silicon layer accommodates stress and strain from any epitaxy onto itself, while held on top of the silicon substrate, thereby reducing the threading dislocations of from any epitaxy onto itself. At operation 606, a semiconductor material is heteroepitaxially grown on the ultra-thin single-crystal silicon layer to form a semiconductor device including an epitaxial layer having a substantially reduced threading dislocation density, and the method ends at operation 608.

As described above, various non-limiting embodiments of the disclosure provide a semiconductor device including an epitaxial layer having substantially reduced threading dislocation density. In one or more non-limiting embodiments, a method of fabricating the semiconductor device including an epitaxial layer having substantially reduced threading dislocation density includes performing a hydrogen implantation process prior to heteroepitaxially growing a semiconductor material on the Si substrate. The substrate is annealed to activate the hydrogen and induces an exfoliation effect that produces an ultra-thin single-crystal silicon layer. The ultra-thin single-crystal silicon layer accommodates stress and strain from any epitaxy onto itself, while held on top of the Si substrate. The thickness of the ultra-thin single-crystal layer accommodates a threading dislocation into the ultra-thin single-crystal silicon, but not into any subsequent epilayer material so as to reduce the threading dislocations of the epilayer. Accordingly, a semiconductor material can be heteroepitaxially grown from the to produce the semiconductor device including an epitaxial layer having substantially reduced threading dislocation density.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

Aspects of the present disclosure are described herein with reference to flowchart illustrations and/or block diagrams of methods, and apparatus (devices) products according to embodiments of the disclosure. The flowchart and block diagrams in the Figures illustrate the architecture, functionality, and operation of possible implementations of the device and method of fabricating the device according to various embodiments of the present disclosure. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present disclosure may be a device and/or method of fabricating the device at any possible technical detail level of integration. The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   implanting dopants comprising hydrogen (H) into a silicon substrate;
   performing a thermal anneal process that activates the implanted dopants, and in response to activating the implanted dopants forming a layer of ultra-thin single-crystal silicon in a portion of the silicon substrate to induce an exfoliation effect that produces a layer of single crystal silicon atop the silicon substrate and accommodates stress and strain into itself while held on top of the silicon substrate; and
   performing a heteroepitaxy process to grow a semiconductor material from the layer of ultra-thin single-crystal silicon,
   wherein the strain and thickness of the ultra-thin single-crystal silicon accommodate a threading dislocation into the ultra-thin single-crystal silicon, and not into the heteroepitaxially grown semiconductor material so as to reduce the threading dislocations of the heteroepitaxially grown semiconductor material.

2. The method of claim 1, wherein the semiconductor material is different from silicon material included in the silicon substrate.

3. The method of claim 1, wherein the layer of ultra-thin single-crystal silicon is contained between a first interfaced defined by direct contact between an underlying portion of the silicon substrate and the layer of ultra-thin single-crystal silicon and a second interface defined by direct contact between the semiconductor material and the layer of ultra-thin single-crystal silicon.

4. The method of claim 3, wherein a distance between the first interface and the second interface defines a thickness of the layer of ultra-thin single-crystal silicon that is less than 100 nm.

5. The method of claim 1, wherein the strain and thickness of the ultra-thin single-crystal silicon accommodate the threading dislocation into the ultra-thin single-crystal silicon, and not into any subsequent epilayer material so as to reduce the threading dislocations of the semiconductor material.

6. The method of claim 1, wherein the semiconductor material extends from an upper region to a lower region that contacts the layer of ultra-thin single-crystal silicon, and wherein the threading dislocation density is reduced between the upper region to the lower region.

7. The method of claim 1, wherein the semiconductor material is selected from a group comprising mercury cadmium telluride (HgCdTe), gallium indium arsenide antimonide phosphide (GaInAsSbP), and indium arsenide-gallium antimonide (InAs/GaSb) superlattices.

8. The method of claim 7, wherein the heteroepitaxy process includes performing molecular beam epitaxy (MBE) process to grow mercury cadmium telluride (HgCdTe) onto the upper surface layer of ultra-thin single-crystal silicon.

9. A semiconductor device comprising:
   a silicon substrate implanted with dopants comprising hydrogen (H);
   a layer of ultra-thin single-crystal silicon in a portion of the silicon substrate, the layer of ultra-thin single crystal silicon atop the silicon substrate and accommodating a stress and strain into itself while held on top of the silicon substrate; and
   a semiconductor material on an upper surface of the layer of ultra-thin single-crystal silicon,
   wherein the strain and thickness of the ultra-thin single-crystal silicon accommodate a threading dislocation into the ultra-thin single-crystal silicon, and not into the heteroepitaxially grown semiconductor material so as to reduce the threading dislocations of the heteroepitaxially grown semiconductor material.

10. The semiconductor device of claim 9, wherein the epilayer has a threading dislocation density of less than about 1e5 cm$^{-2}$.

11. The semiconductor device of claim 10, wherein the layer of ultra-thin single-crystal silicon has a thickness ranging from about 10 nm to about 100 nm.

12. The semiconductor device of claim 10, wherein the layer of ultra-thin single-crystal silicon has a stress and a strain.

13. The semiconductor device of claim 10, wherein the semiconductor material is selected from a group comprising mercury cadmium telluride (HgCdTe), gallium indium arsenide antimonide phosphide (GaInAsSbP), and indium arsenide-gallium antimonide (InAs/GaSb) superlattices.

14. The semiconductor device of claim 9, wherein the layer of ultra-thin single-crystal silicon and the semiconductor substrate define a lower interface.

15. The semiconductor device of claim 14, wherein implanted hydrogen is present in the lower interface.

* * * * *